United States Patent
He et al.

(10) Patent No.: US 7,564,099 B2
(45) Date of Patent: Jul. 21, 2009

(54) MONOLITHIC MOSFET AND SCHOTTKY DIODE DEVICE

(75) Inventors: Donald He, Redondo Beach, CA (US); Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/716,839

(22) Filed: Mar. 12, 2007

(65) Prior Publication Data

US 2008/0224211 A1      Sep. 18, 2008

(51) Int. Cl.
*H01L 29/76* (2006.01)
(52) U.S. Cl. ............... 257/341; 257/330; 257/E29.226; 438/197; 438/237; 438/268
(58) Field of Classification Search ................. 257/330, 257/328, 341, E29.226; 275/155; 438/197, 438/237, 268
See application file for complete search history.

(56) References Cited

U.S. PATENT DOCUMENTS

| | | | |
|---|---|---|---|
| 3,798,514 | A | 3/1974 | Hayashi et al. |
| 4,262,296 | A | 4/1981 | Shealy et al. |
| 4,300,152 | A | 11/1981 | Lepselter |
| 4,513,309 | A | 4/1985 | Cricchi |
| 4,823,172 | A | 4/1989 | Mihara |
| 4,827,321 | A | 5/1989 | Baliga |
| 4,871,686 | A | 10/1989 | Davies |
| 4,903,189 | A | 2/1990 | Ngo et al. |
| 4,982,244 | A | 1/1991 | Kapoor |
| 5,111,253 | A | 5/1992 | Korman et al. |
| 5,525,829 | A | 6/1996 | Mistry |
| 5,821,575 | A * | 10/1998 | Mistry et al. ................. 257/281 |
| 5,886,383 | A | 3/1999 | Kinzer |
| 6,049,108 | A | 4/2000 | Williams et al. |
| 6,274,905 | B1 | 8/2001 | Mo |
| 6,351,018 | B1 | 2/2002 | Sapp |
| 6,433,396 | B1 | 8/2002 | Kinzer |
| 6,529,034 | B1 | 3/2003 | Ranjan |
| 6,593,620 | B1 | 7/2003 | Hshieh et al. |
| 6,617,642 | B1 | 9/2003 | Georgescu |
| 6,621,107 | B2 * | 9/2003 | Blanchard et al. ............ 257/155 |
| 6,686,614 | B2 | 2/2004 | Tihanyi |
| 6,707,101 | B2 | 3/2004 | Ranjan |
| 6,818,939 | B1 | 11/2004 | Hadizad |
| 6,873,994 | B2 * | 4/2005 | Thapar ........................ 257/330 |
| 6,987,305 | B2 | 1/2006 | He et al. |

(Continued)

FOREIGN PATENT DOCUMENTS

JP         10-189969         7/1998

(Continued)

*Primary Examiner*—Sue Purvis
*Assistant Examiner*—Tucker Wright
(74) *Attorney, Agent, or Firm*—Farjami & Farjami LLP

(57) ABSTRACT

A Schottky diode is integrated into a planar or trench topology MOSFET having parallel spaced source regions diffused into spaced base stripes. The diffusions forming the source and base stripes are interrupted to permit the drift region to extend to the top of the die and receive a Schottky barrier metal and the source contact. The MOSFET and Schottky share the same drift region, and the pitch between base and source stripes is not changed to receive the Schottky structure.

10 Claims, 4 Drawing Sheets

U.S. PATENT DOCUMENTS

| | | |
|---|---|---|
| 2002/0000566 A1* | 1/2002 | Tihanyi ................. 257/155 |
| 2002/0134998 A1 | 9/2002 | Van Dalen et al. |
| 2003/0022474 A1 | 1/2003 | Grover et al. |
| 2003/0040144 A1 | 2/2003 | Blanchard et al. |
| 2003/0085422 A1 | 5/2003 | Amali et al. |
| 2003/0207538 A1 | 11/2003 | Hshieh et al. |
| 2004/0119103 A1 | 6/2004 | Thapar |
| 2005/0037579 A1 | 2/2005 | Numazawa et al. |
| 2005/0167742 A1* | 8/2005 | Challa et al. ............ 257/328 |

FOREIGN PATENT DOCUMENTS

| | | |
|---|---|---|
| JP | 11-74514 | 3/1999 |
| JP | 2002-334997 | 11/2002 |
| JP | 2003-38760 | 3/2003 |

\* cited by examiner

MONOLITHIC MOSFET AND SCHOTTKY DIODE DEVICE

FIELD OF THE INVENTION

This invention relates to semiconductor devices and more specifically relates to a power MOSFET and Schottky diode integrated in a common chip.

BACKGROUND OF THE INVENTION

It is frequently desirable to integrate a Schottky diode and MOSFET into a common chip or die and package. For example, in a synchronous buck converter circuit, the low side FET requires a low $R_{dson}$, a low $V_f$ (forward voltage drop) in the third quadrant and a low reverse recovery charge.

Such devices have been proposed in the past in both planar and trench topologies. For example, such a device is proposed by B. J. Baliga and Dev Alok Girdhar; Paradigm Shift In Planar Power MOSFET Technology, Power Electronics, page 24, November 2003. This device has the disadvantage of changed cell pitch and relatively poor use of silicon area.

It is also known to have laterally displaced MOSFET areas and Schottky areas, as in the IRF6691 device of International Rectifier, the assignee of the present application. This structure however, has a significant die area penalty because the drift region of the 2 devices is not shared.

Still another monolithic Schottky and MOSFET is shown in U.S. Pat. No. 6,987,305 (IR-2014).

It would be very desirable to provide a monolithic Schottky and FET which preserves die area and can be fabricated with a minimum change in process as compared to that used to make the MOSFET, and which employs a space saving termination structure.

BRIEF DESCRIPTION OF THE INVENTION

In accordance with the invention, a Schottky structure is inserted in short sections along the length of interrupted source and base diffusion strips of a MOSFET junction pattern. The elongated source strips can be formed in the silicon surface of a planar MOSFET, or in the mesas of a MOSFET in a trench type topology. The novel structure is formed by adding a single mask for masking the P⁻ base region at spaced region to permit the underlying N⁻ body to reach the surface to be contacted by the source/Schottky contact to form the Schottky portion of the device.

The pitch of the source stripes need not change to accommodate the Schottky and the same N⁻ drift region accommodates both the Schottky and MOSFET for a reduced area penalty. Further, a reduced area termination is also created.

DETAILED DESCRIPTION OF THE PREFERRED EMBODIMENT

Figure 2:
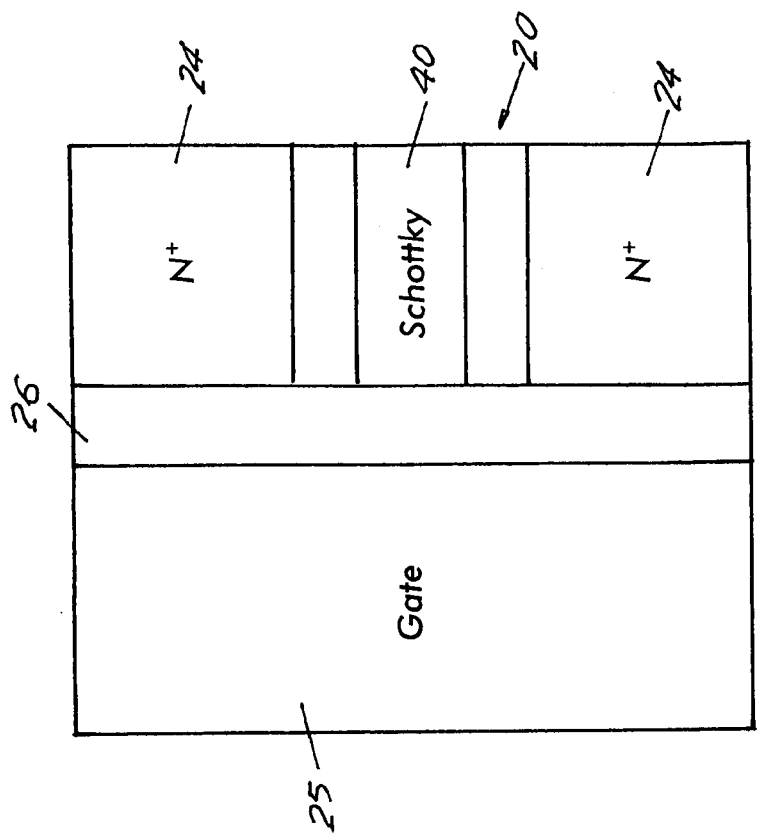
FIG. 2 is a top view of the planar cell of FIG. 1, showing the placement of the Schottky element.
Figure 1:
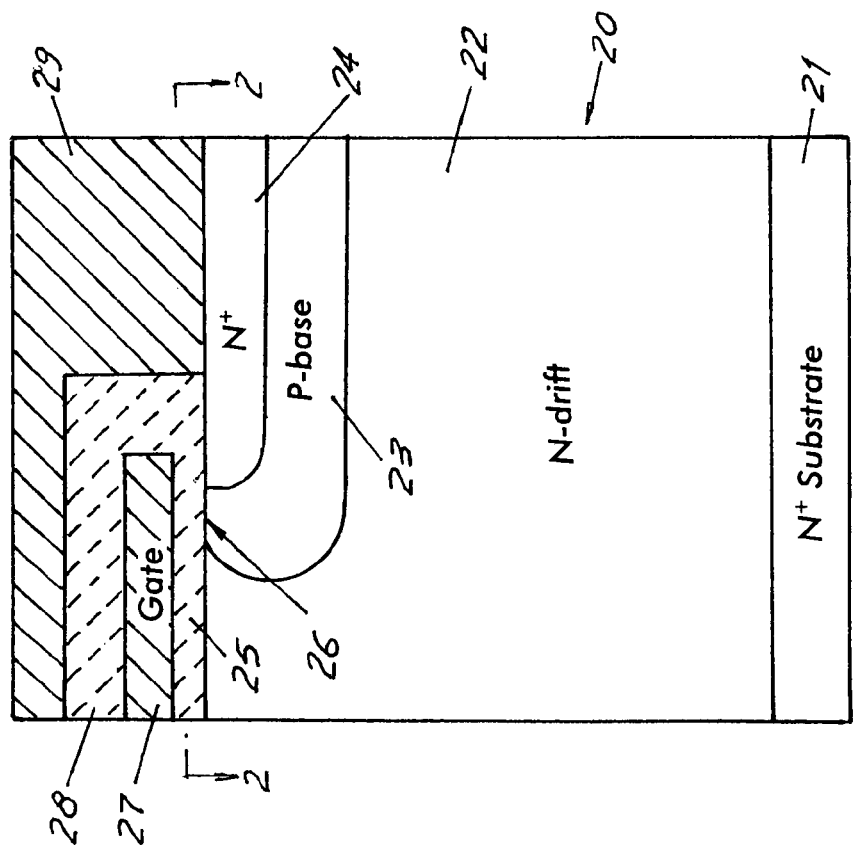
FIG. 1 is a cross-section of one cell of a planar device in which a Schottky region is inserted along the length of the source strip, as shown in FIG. 2.

Referring first to FIGS. 1 and 2, there is shown a planar embodiment in which a small segment of a silicon wafer (or die) 20 has the conventional N⁺ substrate 21 and an N⁻ drift region 22 which is usually an epitaxially deposited silicon layer. A plurality of parallel spaced P type base strips, one of which is shown as P⁻ strip 23 are diffused into drift region 22, and a plurality of N⁺ source strips, one of which is shown as strip 24 are diffused into the P base in the usual manner. A gate oxide 25 is formed over the invertible channel region 26 between source 24 and base 23 and a conductive polysilicon gate electrode 27 is formed atop oxide 25. An insulation layer 28, usually TEOS, covers and insulates conductive gate 27 from source electrode 29, usually aluminum.

In accordance with one aspect of the invention, the length of N⁺ source strip 24 and base diffusion 23 are interrupted as shown in FIG. 2 and a Schottky device 40 is formed at that location. More specifically, the base diffusion 23 and source diffusion are blocked in area 40 and a Schottky contact is made to the exposed N⁻ drift in area 40. If desired, a conductive silicide barrier can be first formed atop the exposed N⁻ drift region, and covered by the aluminum contact. One or more such Schottky contacts may be formed in each of the base and source strips in FIGS. 1 and 2.

Figures 3, 4:
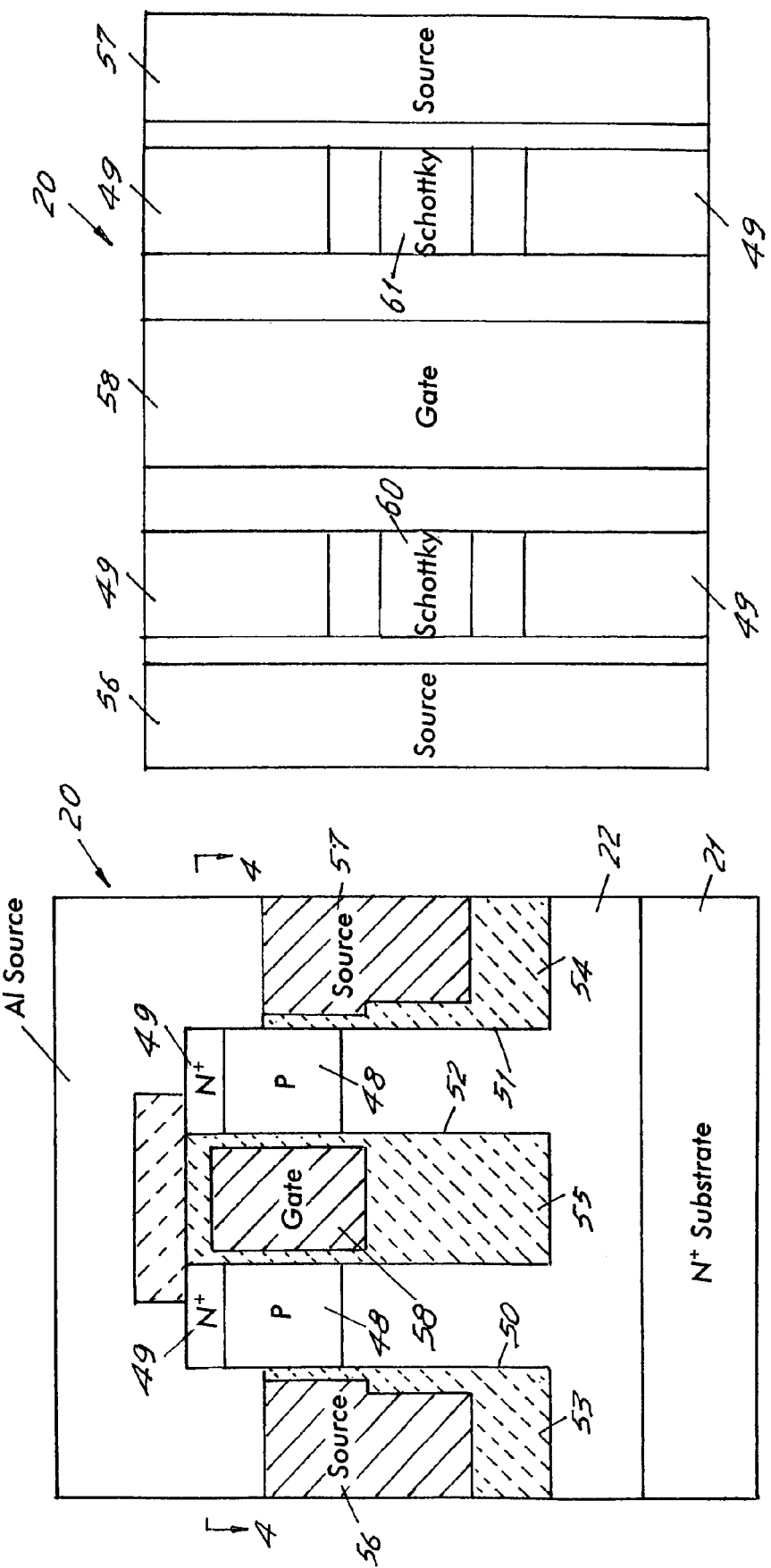
FIG. 3 is a cross-section of one cell of a trench MOSFET in which a Schottky region is inserted along the length of the source strips in the mesas, as shown in FIG. 4.
FIG. 4 is a top view of FIG. 3 showing the Schottky regions inserted gaps in the source strips.

FIGS. 3 and 4 show an embodiment in which the Schottky diode can be incorporated into a trench type MOSFET. Thus, the starting silicon 20 has the usual N⁺ substrate 21 and N⁻ layer 22. A P type channel diffusion 48 is formed in the top surface of layer 22 and an N⁺ source layer is formed atop channel region 48. Plural spaced source trenches 50, 51 and a gate trench 52 are formed through source layer 49 and P channel region 48 and into silicon layer 22 as shown in FIG. 3. These trenches are then filled with insulation, for example, oxide bodies 53, 54 and 55 respectively, which is etched to receive conductive polysilicon source bodies 56 and 57 and a conductive gate polysilicon 58 respectively. A thin gate oxide (or nitride) is left between channel 48 and source bodies 56, 57 and gate 58. A conductive source electrode, usually aluminum is deposited atop the wafer or die, in contact with source diffusions 49 and source polysilicon masses 56 and 57.

As shown in FIG. 4, the source and base diffusions are patterned by suitable masks so that the N⁻ region 22 reaches the device surface at Schottky areas 60 and 61 where they can be contacted by the source 49 or some other Schottky forming metal layer. Thus, the novel Schottky structures are formed in the mesas between trenches 50 and 52 with no reduction in device pitch due to integrating Schottky devices and with little interference with the manufacturing process.

Figure 5:
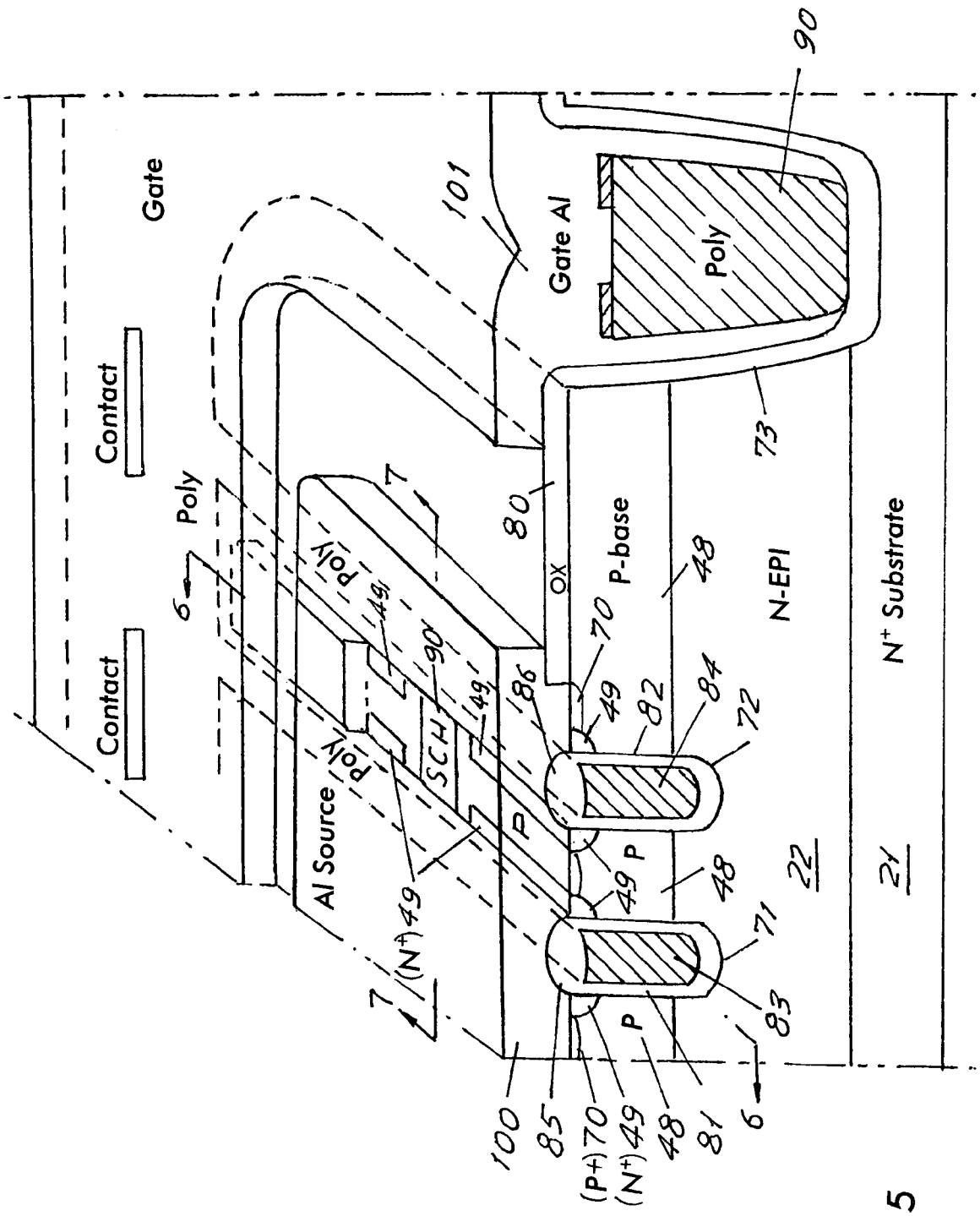
FIG. 5 is an isometric view of a die containing an embodiment of the invention, along with the novel termination structure.
Figure 6:
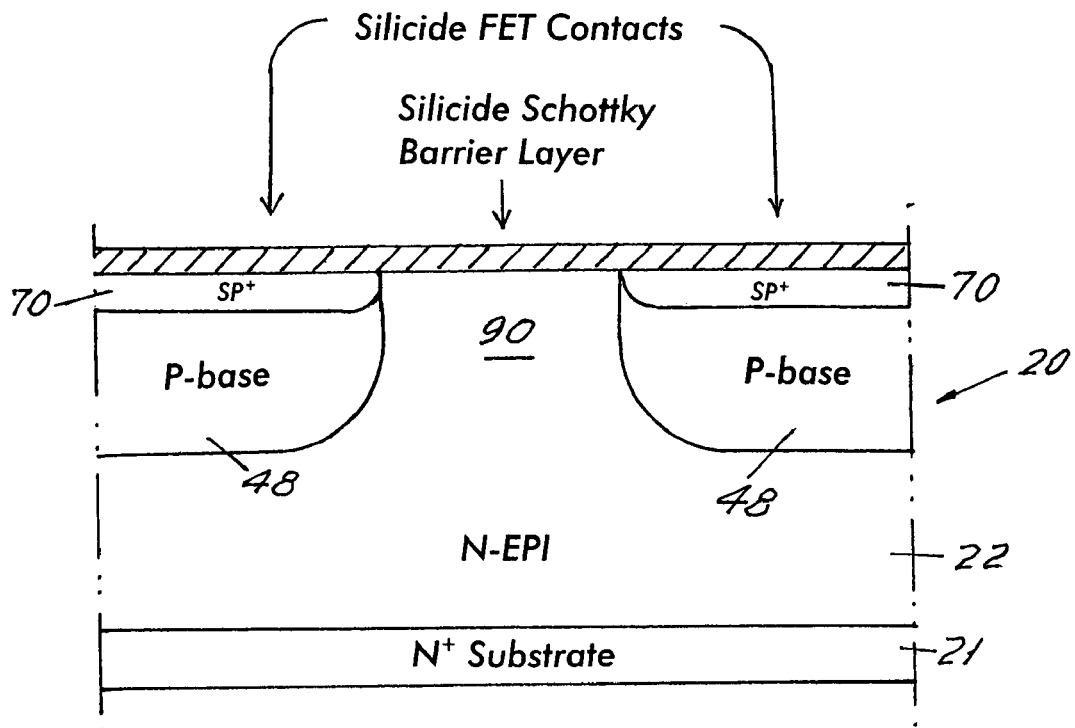
FIG. 6 is a schematic cross section of FIG. 5 taken across section line 6-6 in FIG. 5 to show the Schottky structure in the trench FET strips.
Figure 7:
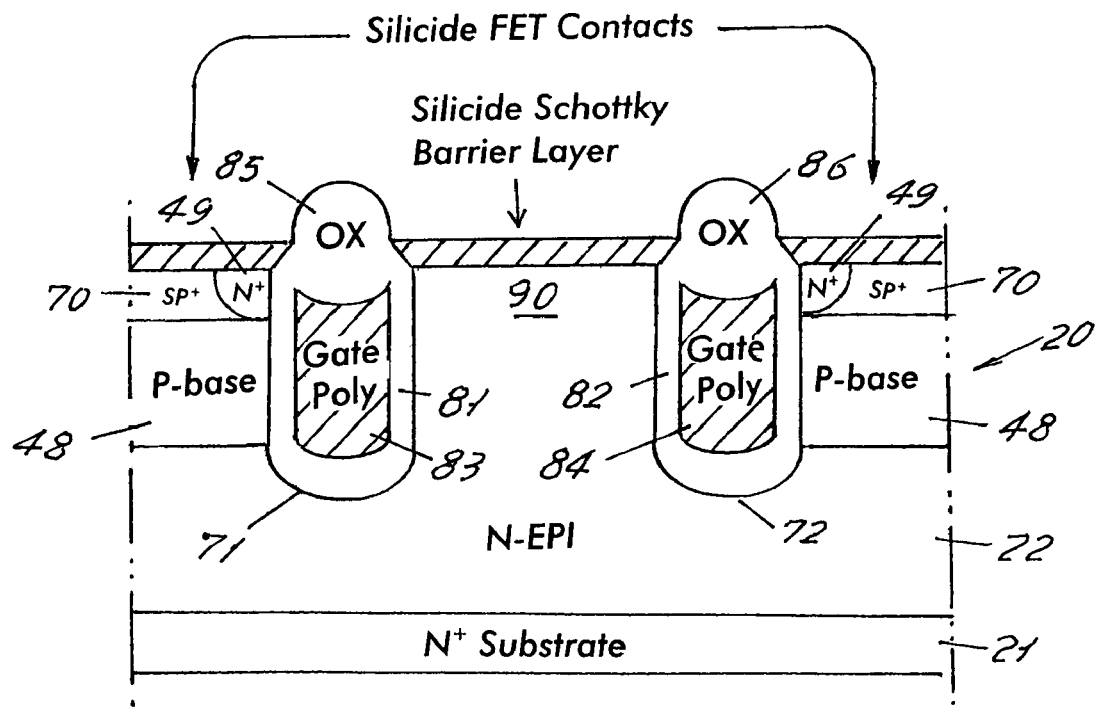
FIG. 7 is a schematic cross-section of FIG. 5 perpendicular to the FET trench strips.

FIGS. 5, 6 and 7 show a further trench embodiment of the invention, FIG. 5 showing the structure in partial isometric form, with the device termination. Thus, the starting wafer 20 has an N⁺ substrate 21, and N⁻ epitaxially formed layer (drift region) 22. A P⁻ base diffusion 48 is formed in layer 22 and an N⁺ source diffusion 49 is formed in base layer 48. Further P⁺ base contact diffusions 70 are also formed, as usual.

The device active region is formed of a plurality of spaced trenches 71, 72, and a termination trench 73 is also formed and surrounds the die. An oxide layer 80 overlies the surface of base 48 at the outer periphery of the die and into termination trench 73.

Trenches 71 and 72 are lined with gate oxides 81 and 82 respectively and are filled with conductive polysilicon gates 83 and 84 respectively. Insulation caps 85 and 86 seal and insulate the tops of polysilicon stripe masses 83 and 84.

A further conductive polysilicon mass 90 fills termination trench 76.

As best shown in FIGS. 6 and 7 short sections of the P base 48 and N$^+$ source 49 and SP$^+$ contact region 70 are eliminated along the length of the P base to expose a Schottky area 90 at which the N– epi region 22 reaches the surface of die 20. Preferably, a thin conductive silicide, for example titanium silicide contacts the surface of region 90 and the N$^+$ and P$^+$ regions 49 and 70, forming a Schottky barrier to N$^-$ silicon 22 in area 90.

A contact metal, for example, aluminum is then deposited atop the chip and, as shown in FIG. 5, is etched to form source contact 100 and gate contact bus 101. Source contact 100 contacts source regions 49 and SP$^+$ regions 70, and gate bus 100 contacts trench polysilicon ring 90. Note that the ends of polysilicon strips 83, 84 extend to and contacted by gate aluminum bus 90.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An integrated MOSFET and Schottky diode comprising a silicon die having a planar top surface and a bottom surface, a body portion of one conductivity type extending toward said top surface, a plurality of parallel base strips of another conductivity type extending into said body portion from said top surface; a plurality of source region strips extending into respective ones of said base strips to define invertible channel regions; and a gate structure extending along a same direction as said parallel base strips for each of said invertible channel regions; at least selected ones of said source and base strips having interruption areas to serve as schottky regions along their lengths and oriented transverse to the longitudinal axis thereof and the longitudinal axis of at least one gate structure; said body portion extending to said top surface at said interruption areas; a source contact connected to said source regions and a Schottky contact connected to said body portion at said interruption areas.

2. The device of claim 1, further comprising a conductive silicide connected directly to said interruption areas.

3. The device of claim 1, wherein said body portion is N$^-$ type conductivity.

4. The device of claim 1, wherein said device is a planar device and said invertible channel regions are parallel to said top surface.

5. The device of claim 1, wherein said device is a trench type device and said invertible channel regions are perpendicular to said top surface.

6. The device of claim 5, wherein said device has plural spaced trenches defining mesas between adjacent pairs of trenches; said source region strips being disposed along the top edges of said mesas, and conductive polysilicon gate masses filling at least selective ones of said trenches.

7. The device of claim 6, which further includes a termination trench in the outer periphery of said die and containing a conductive polysilicon mass; and a conductive gate bus disposed on said top surface and contacting each of said polysilicon gate masses.

8. The device of claim 1, wherein said source contact and said Schottky contact are insulated segments of a common conductive layer.

9. The device of claim 6, which further includes a conductive silicide connected directly to said interruption areas.

10. The device of claim 6, wherein said source contact and said Schottky contact are insulated segments of a common conductive layer.

\* \* \* \* \*